United States Patent [19]

Oberbeck

[11] 4,044,305

[45] Aug. 23, 1977

[54] APPARATUS FOR PROVIDING A DISPLACEMENT REPRESENTATIVE OF THE MAGNITUDE OF A SIGNAL

[75] Inventor: George A. Oberbeck, Belmont, Mass.

[73] Assignee: The Charles Stark Draper Laboratory, Inc., Cambridge, Mass.

[21] Appl. No.: 558,960

[22] Filed: Mar. 17, 1975

[51] Int. Cl.² .......................... G01R 5/14; G01R 1/00
[52] U.S. Cl. ................................. 324/154 R; 324/147
[58] Field of Search ............... 324/125, 137, 146, 147, 324/151, 152, 154, 133; 310/93, 103; 335/224, 225

[56] References Cited

U.S. PATENT DOCUMENTS

| 1,130,633 | 2/1915 | Roller | 324/133 X |
|---|---|---|---|
| 1,705,158 | 3/1929 | McCoy | 324/146 X |
| 2,002,445 | 5/1935 | Arey et al. | 324/146 |
| 2,379,417 | 7/1945 | Conrad | 324/147 X |
| 2,409,866 | 10/1946 | Jewell | 324/146 X |
| 2,490,234 | 12/1949 | Shannon | 324/152 UX |
| 2,897,447 | 7/1959 | Clark | 324/147 |
| 2,919,406 | 12/1959 | Tschappu | 324/137 X |
| 2,940,044 | 6/1960 | Warsaw | 324/137 X |
| 3,493,905 | 2/1970 | Foulke et al. | 324/125 |

*Primary Examiner*—Gerard R. Strecker
*Attorney, Agent, or Firm*—Weingarten, Maxham & Schurgin

[57] ABSTRACT

A device for providing a displacement representative of the magnitude of a signal. The device typically includes a rotor having a plurality of sections of high permeability material separated by areas of high reluctance. A magnetic flux is applied to a section of the rotor to produce an elastic restraint torque varying with angle, while another high permeability section responds to variations in the magnetic flux caused by the signal to produce a torque representative of the signal magnitude. This latter torque moves the rotor to the point where the restraint torque increases sufficiently to balance the signal torque. The resultant angle of rotation represents signal magnitude. The device may also be operated to provide a signal output representative of an input torque or force.

12 Claims, 9 Drawing Figures

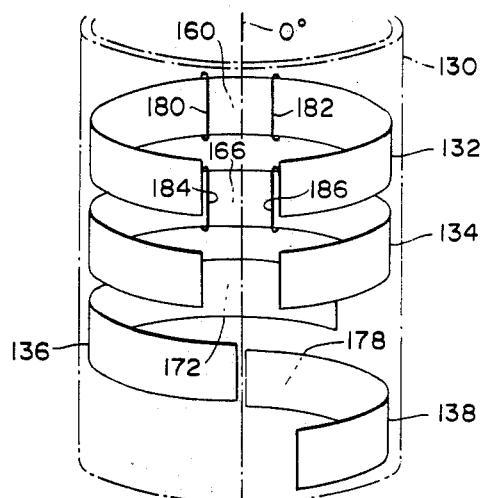
FIG. 7
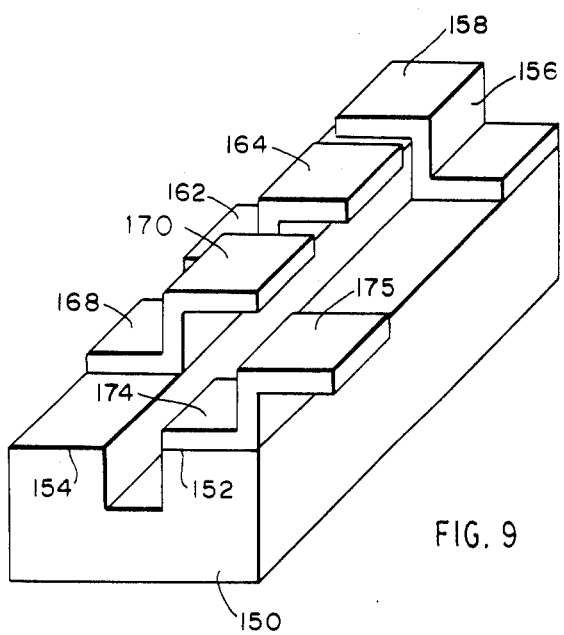
FIG. 9
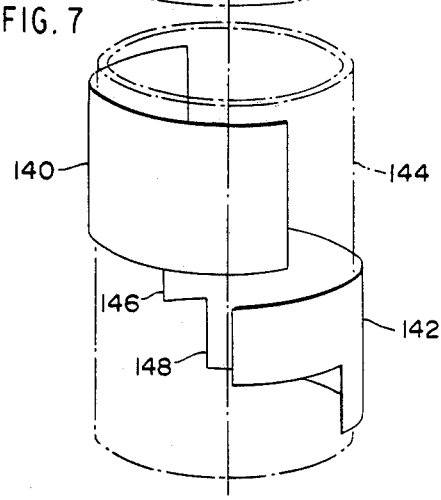
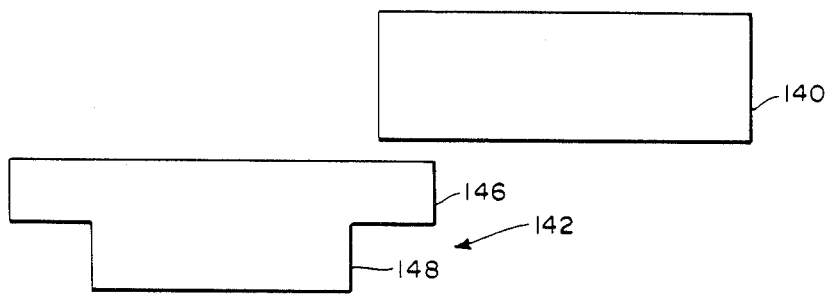
FIG. 8
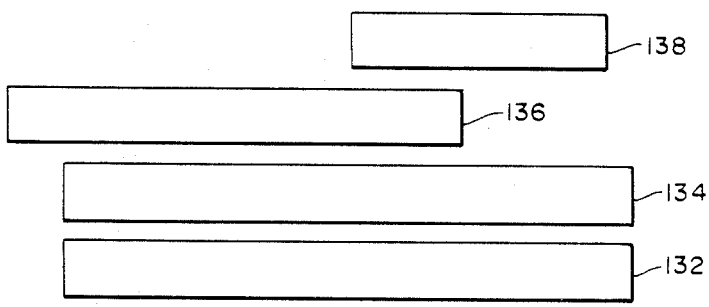

APPARATUS FOR PROVIDING A DISPLACEMENT REPRESENTATIVE OF THE MAGNITUDE OF A SIGNAL

FIELD OF THE INVENTION

The present invention relates to magnetic displacement devices and in particular to a displacement device having only magnetically induced elastic restraint and displacement forces.

BACKGROUND OF THE INVENTION

In applications such as electrical meters, fluid flow control valves, or camera aperture control elements, there is a need for a rugged transducer which can withstand the mechanical loading often encountered in their environments and which can be made at a cost compatible with their mass use in inexpensive products. In typical meter or actuator movements, a mechanical spring is employed to provide elastic restraint against the torque representative of the control or measurement signal. Such springs are a common area of meter failure or inaccuracy. In addition, the use of a spring in such instruments raises the cost of parts and construction.

BRIEF DESCRIPTION OF THE INVENTION

In accordance with the preferred embodiment for the present invention, a meter or actuator is provided in which both the motional force and the elastic restraint are provided magnetically by the action of an applied flux on a rotor element partitioned into sections of magnetically isolated, high permeability material. In the preferred construction of the present apparatus, the rotor element includes a section of high permeability which reacts with a magnetomotive force (MMF) applied from a stator structure to provide an elastic restraint for the rotor to a predetermined angular position. An additional section of the rotor reacts with variations in the MMF created in response to an input signal to generate a corresponding torque forcing the rotor to a point where the torque and elastic restraints just balance each other. The magnitude of the elastic restraint varies with angular deviation of the rotor from the centered position on a nearly linear scale. The restraint force is also independent of the torque producing signal in the preferred configurations. The actuator construction on the other hand produces a rotor torque which is a function of the magnitude of the applied signal and independent of rotor angular displacement. The rotor will turn in response to this torque until an angle is reached at which the elastic restraint force equals the torque. In this manner, a linear deflection of the rotor with input signal amplitude is achieved.

Instead of producing a flux in response to an input signal, a torque input signal, a torque input can be applied against the elastic restraint, and where the restraint flux is alternating, a signal proportional to torque will be produced in the coils of the stator structure.

The ruggedness of the construction of the present meter or actuator permits the realization of high force units.

BRIEF DESCRIPTION OF THE DRAWINGS

These and other features of the present invention are illustrated below in the detailed description of the preferred embodiment, presented by way of example and not limitation, and in the accompanying drawing of which:

FIGS. 7, 8 and 9 illustrate a further embodiment of the present invention suited for mass fabrication and respectively show a schematic view of a stator and withdrawn rotor, a positioning diagram of low reluctance stator and rotor elements, and a schematic view of a permanent magnet for attachment to the stator.

DETAILED DESCRIPTION OF THE PREFERRED EMBODIMENT

Figure 1:
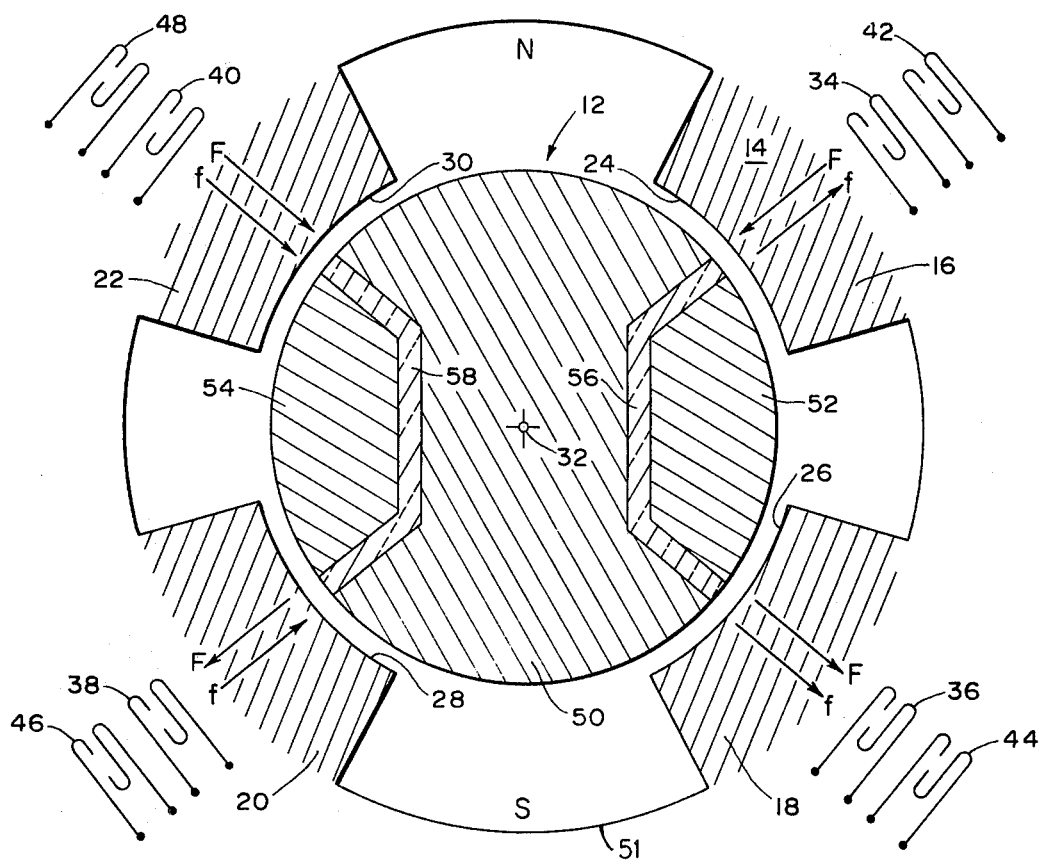
FIG. 1 is a sectional view of a meter or actuator rotor and stator configuration according to a first embodiment of the present invention.

The present invention contemplates a meter or actuator structure typically for rotary motion, but useful for linear motion, having a rotor and stator structure which provides both elastic restraint and signal responsive torque.

The construction and operation of a meter or actuator according to the present invention is described with reference to a first embodiment shown in FIG. 1. A rotor 12 is positioned within a stator having a plurality of magnetic poles 16, 18, 20 and 22 with respective pole faces 24, 26, 28 and 30 facing the rotor 12. The rotor 12 is mounted for rotation about an axis 32. A set for primary coils 34, 36, 38 and 40 are wound about respective poles 16, 18, 20 and 22. The coils 34-40 are series connected and excited with a primary current I-P to generate a magnetomotive force (MMF) F and resulting magnetic flux in each of the poles. Secondary coils 42, 44, 46 and 48 are also wound about each of the respective poles 16-22 and series connected to conduct a secondary current I-S responsive to an input signal to generate an MMF f and corresponding flux as shown in the poles 16-22.

The MMF generated by the primary current is shown to be generally into the rotor 12 at the top of the page and generally out of the rotor 12 at the bottom of the page creating a north-south polarization as shown in FIG. 1. For a given polarity of secondary current I-S, the MMF resulting therefrom will either reduce or reinforce the primary current MMF F in opposite poles as shown.

The construction of the rotor 12 includes a high permeability section 50 running generally up and down the drawing of FIG. 1 in an hourglass shape which is typical of the rotor for a four-pole torque generator unit as it is known in the art. It can be seen that the surface portions of the section 50 confront, at center, approximately one-half of each of the pole faces 24-30, and that a high permeability magnetic circuit exists through the section 50 from each of the pole faces 24—30 after crossing the air gap between the rotor and stator poles. In addition, two opposite sections 52 and 54 are contained within the rotor 12 and include surface portions which confront the other half of each of the pole faces 24-30. The high permeability sections 52 and 54 are separated from each other and from the high permeability section 50 by low permeability spacers 56 and 58.

Each of the sections 52 and 54 provide a high permeability flux circuit between the two pole faces they abut, but a low permeability flux circuit between other pole faces.

In operation, the initial assumption is made that the MMF f from the secondary current I-S is zero, but that the primary current MMF F is at a fixed level. Indeed, a permanent magnet source for the primary current MMF F may be substituted for the electromagnetic source, as desired. Under these flux conditions, both the section 50 and the sections 52 and 54 provide independent low reluctance flux paths for the primary current flux through the rotor 12. If the rotor were to be rotated slightly, the net flux through the portion 50 would not change significantly since the confronting surfaces at the pole faces 24 and 30 where the flux enters would remain constant as would the confronting surface area with the exit pole faces 26 and 28. Since each section 52 and 54 must independently receive and return this flux, as the element 12 rotates, its total reluctance will increase since the limiting factor will be the smaller confronting area. The increasing reluctance through the sections 52 and 54 with rotation of the element 12, in either direction, will contribute a net restorative force to the rotor 12 elastically restraining it to the approximate centered position as shown in FIG. 1. Mathematically, this torque will be proportional to the angle of deviation of the rotor 12 from its centered position, and to the square of the MMF F.

If a secondary current is now caused to flow in the coils 42-48, an additional MMF f of the polarity shown, or opposite polarity, will be induced in each of the poles 16-22. Each pole will accordingly have a different net flux, the flux in poles 18 and 22 being reinforced and those in poles 16 and 20 being diminished. For limited variations in total flux, the elastic restraint forces will not change appreciably but the flux flowing between the poles through the section 50 will be concentrated more through one pair or set of opposite poles, such as poles 18 and 22 in the example shown, thereby urging the rotor 12 to turn and expose a greater surface area of the section 50 to the pole faces 26 and 30 of those respective poles 18 and 22. Mathematically, this torque will be independent of angle and a linear function of the level of the applied secondary signal I-S. There will result a rotation of the element 12 to the point where the torque induced by the secondary current balances the elastic restraint torque. A complete meter or actuator movement is thereby achieved.

As an alternative to the use of the individual primary coils 34, 36, 38 and 40, and individual secondary coils 42, 44, 46 and 48 in the FIG. 1 embodiment, it is possible to employ a single primary coil and single secondary coil where there is a common, low reluctance magnetic path between the poles 16, 18, 20 and 22 as through a bottom plate 51 above which the respective poles extend on high permeability pillars. In such cases, a single primary coil is wound about the bottom plate 51 passing between the stator poles 20 and 22 on the one hand, and the poles 16 and 18 on the other hand. This would provide a primary magnetomotive force "F" of the polarity shown in FIG. 1. Similarly, a single secondary coil can be wound about the plate 51 between the poles 16 and 22 on the one hand, and the poles 18 and 20 on the other. Such a coil would also produce the secondary magnetomotive force "f" of the polarity shown in FIG. 1.

As can be seen from the sectional representation of FIG. 1, the meter or actuator of the present invention requires no delicate spring part. It can, moreover, be economically produced in a planar or pancake design using stamped components which may then be cemented together or supported by a substrate to greatly reduce fabrication costs for both parts and assembly time. In addition, since the resultant angular output is proportional to the ratio of the secondary signal current I-S to the primary signal current I-P, it is possible to employ the device as a ratio or gain indicating instrument as, for example, an efficiency meter, by varying the primary current I-P in response to an input power level and varying the secondary current in response to an output power level. Likewise, the gain of an amplifier can be determined by applying a signal representative of the amplifier input as the primary excitation and a signal representing the amplifier output as the secondary excitation.

The embodiment of FIG. 1, and others according to the present invention, can be employed to produce a signal output proportional to torque applied to the rotor 12. Where the primary excitation is an alternating current, the secondary coils 42-48 will produce a net output signal proportional to torque applied to rotor 12. The restraint from the primary current prevents the rotor 12 from rotating freely. The phase of the secondary signal will be indicative of direction of applied torque.

Figure 2:
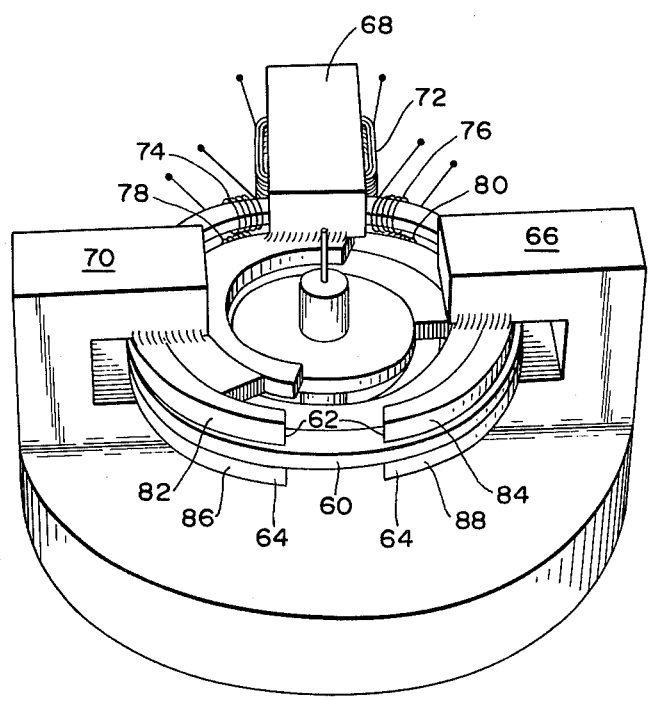
FIG. 2 is a pictorial view of a meter or actuator according to a second embodiment of the present invention.
Figure 3:
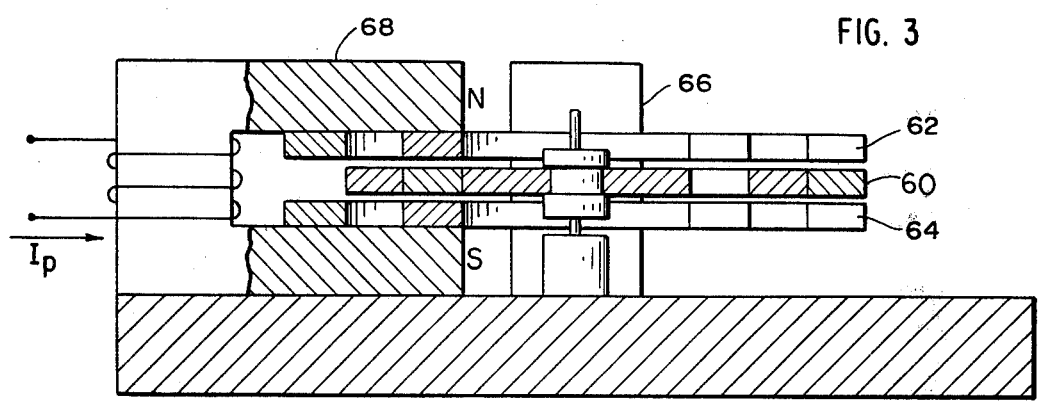
FIG. 3 is a side sectional view of the meter or actuator of FIG. 2.

The restraint and torque portions of FIG. 1 need not be coplanar and the poles may be other than radial such as axial which is shown in a further embodiment of the present invention illustrated in FIG. 2. A meter or actuator is shown having a large angle operating range. A rotor 60 is rotationally supported between a stator having upper and lower portions 62 and 64 respectively. The stator portions 62 and 64 are supported by U brackets 66, 68 and 70. The brackets 66 and 70 are high reluctance and the bracket 68 is high permeability and has a primary coil 72 wound around it to apply primary MMF F between the portions 62 and 64 of the stator as is more clearly illustrated in side sectional view, in FIG. 3. The stator sections 62 and 64 have secondary coils 74, 76, 78 and 80 wound on either side of the point of attachment of bracket 68 to respond to the input signal to vary the flux applied to each of the left- and right-hand arms 82 and 84 for the stator portion 62 and arms 86 and 88 for the stator portion 64.

Figure 4:
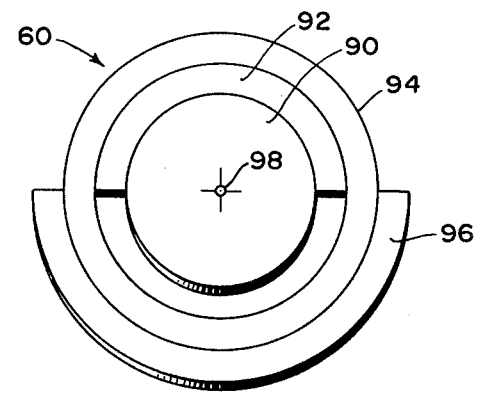
FIG. 4 is an overhead view of the rotor alone for the embodiment of FIG. 2.
Figure 5:
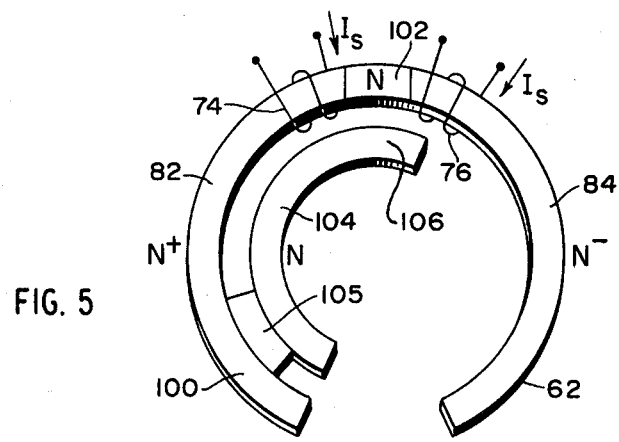
FIGS. 5 and 6 are overhead views of top and bottom stator elements respectively for the embodiment of FIG. 2.
Figure 6:
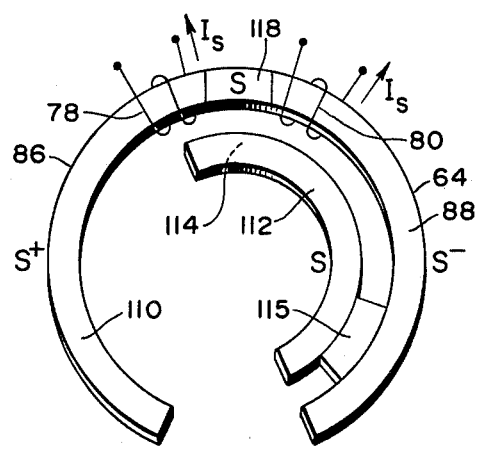

The stator and rotor construction are shown more clearly in FIGS. 4-6, showing individual top views of the units. As shown in FIG. 4, the rotor includes a central, high reluctance or low permeability disc 90, typically fabricated of aluminum, surrounded by a semicircular annular band 92 of high permeability substance such as a nickel iron alloy. Concentric to the annular band 92 is a further annular band 94 typically fabricated of a high reluctance material like aluminum, while an outer semicircular annular band 96 of a high permeability substance is attached to the outside edge of the band 94 in a position diametrically opposite to the other high permeability band 92. The rotor 60 is rotationally supported about its center by pivot means 98.

The top stator portion 62 is illustrated in FIG. 5 to include an annular band 100 forming nearly a complete circle and having a radius matching that of the semicircular annular band 96. The band 100 includes the left- and right-hand arms 82 and 84 either side of the point of attachment 102 to the bracket 68 through which flux from the primary coil is applied to the stator portion 62. An annular section 104 of radius similar to that of annular portion 92 and concentric to the annular band 100 is attached to bracket 68 at a location 106 in order that flux may be applied to the section 104 through bracket 68 from the primary coil. A spacer 105 helps to support the outer arm of section 104 in the appropriate location. The section 104 is fabricated of high permeability material to readily accept the flux from the bracket 68. The stator portion 62 is secured by the brackets 66, 68 and 70 such that the axis of rotation for the rotor 60 is coextensive with the center for the annular bands 104 and 100. The coils 74 and 76 are wound either side of the point of attachment 102 and are serially connected to carry the secondary current I-S in a polarity to oppositely affect the flux in the arms 82 and 84 as shown in FIG. 5 depending upon the polarity of the secondary current I-S. Thus, if as shown, the primary flux creates a north magnetic pole out of the stator portion 62, the application of current in the secondary coils in the polarity illustrated in FIG. 5 will tend to strengthen the pole in the arm 82 and weaken it in the arm 84.

The lower stator portion 64 is nearly a mirror image of the upper portion 62 as illustrated in FIG. 6. The stator 64 includes an outer annular band 110 identical in shape and size to the band 100 in FIG. 5 and comprising arms 86 and 88. Similarly, an inner section 112 of high permeability is attached to bracket 68 at position 114 to receive flux from the primary coil. A spacer 115 further supports the section 112 at its extremity. The annular bands 110 and 112 are also of high permeability, or low reluctance, material. The lower stator portion 64 is secured by the brackets 66, 68 and 70 so that the geometric center for the annular bands 110 and 112 is coincident with the axis of rotation for the rotor 60. The coils 78 and 80 are wound either side of a point of attachment 118 for band 110 to the bracket 68 through which magnetic flux from the primary coil is applied to the stator portion 64. The coils 78 and 80 are wound in series with the coils 74 and 76 to carry the secondary current I-S and to reinforce and weaken the magnetic flux in the arms 86 and 88 for the polarity of current illustrated in FIGS. 5 and 6.

In operation, the annular band or sections 104 and 112 provide the magnetic poles for elastic restraint of the rotor 60 through the high permeability annular band 92. Any rotation of the rotor 60 from its orientation shown in the drawing of FIG. 4 with respect to the stator portions 62 and 64 will increase the reluctance of the magnetic circuit between the poles 104 and 112 through the portion 92 tending to restrain it to the position shown. The application of a secondary current will reinforce the strength of the flux between the same sides of the outer annular bands of the stator portions 62 and 64, tending to draw the low reluctance rotor band 96 into that portion of the rotor structure until the restraint torque balances the attraction torque.

The embodiment of FIGS. 2-6 for the present invention is particularly useful for large angle displacement meters or actuators. As can be seen from the illustration in the drawing, the device according to this latter embodiment can also be manufactured from stamped parts easily produced and assembled.

For efficient operation, it should be noted that the high permeability members of the invention described above should have as low a hysteresis as possible, as by proper heat treating of the material.

As a point of distinction between the two embodiments shown above, the actuator shown in FIGS. 2-6 has as the magnetomotive force in the restraint elements the force resulting solely from the primary excitation, whereas in the FIG. 1 structure, the restraint MMF's will differ between the sections 52 and 54 as the sum and difference of the primary and secondary MMF's F and f respectively. Through a modification to the structure shown in FIGS. 2-6 by the deletion of sections 92, 104 and 106, the device can be employed as a large angle displacement microsyn type signal generator or torque generator depending upon whether the secondary coil is used as a signal detector or for application of torquing excitation.

A further embodiment of the present invention, particularly suited for economic mass production using punch pressed parts is illustrated in FIGS. 7, 8 and 9. As shown in FIG. 7, the stator includes a series of high permeability magnetic bands adapted to be contained within a cylindrical housing 130, typically of plastic. The bands include first and second bands 132 and 134 which are axially displaced from each other and extend circumferentially to form a nearly complete circle. A further band 136 of similar radius is located axially displaced from the band 134. Band 136 extends circumferentially about the inside of cylinder 130 from a point aligned with a middle of the gap between the ends of the bands 132 and 134 for an arc of approximately 240°. A final band 138 of radius similar to the band 136 is placed axially displaced from it on the inside of the cylinder 130. Band 138 extends from a point directly opposite the end of the band 136 on the inside of the cylinder approximately 130° along the inside circumference. Bands 132-138 are all coaxial to the axis of housing 130. To give a better representation of the angular extent of each of the bands 132, 134, 136 and 138, they are shown in FIG. 8 against a linear degree scale as they would appear if unrolled. The 0° point corresponds to the rear of the cylinder 130 as illustrated in FIG. 7.

The rotor in FIG. 7 comprises a set of high permeability bands 140 and 142 applied to the outer surface of a, typically plastic, cylinder 144 adapted to be mounted within the cylinder 130 for rotation. The band 140 is adjacent the bands 132 and 134, and of sufficient axial length to permit it to radially face each of the bands 132 and 134. The band 142 is similarly positioned to face both the bands 136 and 138. The band 140 occupies approximately 195° along the circumference of the cylinder 144. The band 142 has a first portion 146 facing the band 136 and extending approximately 225° and a second portion 148 facing the band 138 and extending approximately 135°. The relative angular placement of the bands 142 and 140 is illustrated in FIG. 8 on the same graph as used for the bands 132-138. The bands 132, 134, 136, 138, 140 and 142 may be of any low reluctance high permeability material, such as described above and dimensioned in thickness and axial length to provide a low reluctance path.

Magnetic flux is applied to the stator bands 132, 134, 136 and 138 from a permanent magnet structure 150 illustrated in FIG. 9. The structure 150 illustrated in FIG. 9. The structure 150 is typically an elongated channel-shaped permanent magnet having elongated north and south pole faces 152 and 154 respectively. A set of soft iron brackets are applied to the pole faces 152 and 154 to direct flux through the low reluctance path of the soft iron to the bands 132-138. In particular, a soft iron bracket 156 contacts the north pole 152 on one end and at the other end 158 is attached to the band 132 at a point 160 thereof to apply flux thereto. Similarly, a bracket 162 is attached at one end to the south pole 154 of the permanent magnet 150 and has its other end 164 applied to the band 134 at position 166. A bracket 168 is attached to the south pole 154 of the magnet 150 at one end and applies flux through its opposite end 170 to the band 138 at the position 172. Finally, a bracket 174 is attached to the north magnetic pole 152 and has its opposite end 175 attached to the band 138 at the position 178.

As shown in FIG. 7, the bands 132 and 134 have coils 180 and 182; and 184 and 186 respectively wound about their centers and connected such that the application of a typical signal to the coil in a first polarity reinforces the flux in the right-hand portion of the bands 132 and 134 and decreases it in the left-hand portion, thereby urging the band 140 and rotor 144 in a counter-clockwise direction. The elastic restraint increasing with deflection is produced by the bands 136 and 138 in conjunction with the band 142. It can be seen that the path for flux between the points of application 172 and 178 has equal surface areas between the band 142 and each of the bands 136 and 138 at zero degrees. counterclockwise rotation of the element 142 from this position reduces the surface area with the band 138 and increases the surface area with the band 136. There is a resulting reluctance increase producing a restoring torque proportional to angle.

The unit of FIGS. 7–9 may also be used as an indication of torque in the manner described above for the prior embodiments. The structure of the unit shown in FIGS. 7–9 can be seen to be readily fabricated using stamping or punching techniques and conventional permanent magnets.

The above detailed description of the preferred embodiment is intended for illustration of the invention, the scope of which is indicated in the following claims.

What is claimed is:

1. Apparatus for providing a displacement proportional to a signal magnitude comprising:
   an element having first and second sections of high magnetic permeability separated by a spacer of low magnetic permeability;
   means for motionally suspending the element;
   means for applying a first magnetic flux to said element and to the first and second sections thereof;
   said first and second sections being configured to provide a variation in the reluctance for said first magnetic flux through the first section with motion of said element and a generally lesser variation in reluctance to the first flux through the second section with motion of the element thereby producing a force on said element dependent upon position thereof; and
   means for applying a second flux representative of said signal through said element;
   said first and second sections being further configured to provide a variation in the reluctance of said second section to said second flux with motion of said element without substantially changing said force resulting from said first flux;
   said element moving in response to the second flux applied in response to said signal to a point representative of said signal.

2. Apparatus for providing a displacement representative of the magnitude of a signal comprising:
   an element having a plurality of high permeability sections separated by an area of low permeability;
   means for directing magnetic flux through said element;
   means for generating a magnetic flux for direction through the sections of said element;
   said sections being configured to provide a restraint force on said element urging it toward a predetermined position with respect to said flux directing means, the restraint force increasing with displacement of said element from said predetermined position;
   means for generating further magnetic flux representative of the magnitude of said signal to direct a flux through the sections of said element;
   said sections being configured to force said element to displace from said predetermined position in response to said further magnetic flux;
   said element displacing in response to the further flux to a position where the force from said further flux balances the restraint force from the first mentioned flux.

3. The apparatus of claim 2 wherein the force responsive to said further flux is generally independent of the displacement of said element and said restraint force resulting from the first mentioned flux in said element generally increases linearly with a parameter of displacement for said element.

4. The apparatus of claim 3 wherein:
   said element is suspended for rotational movement; and
   the forces resulting from said first and further fluxes induce a torque on said element.

5. Apparatus for producing a motional response representative of an applied signal magntidue comprising:
   an element sectioned into regions of high magnetic permeability separated by regions of low permeability;
   means for motionally suspending said element;
   means for applying a flux through the sections of said element in a predetermined pattern;
   said sections of said element being configured to induce an elastic restraint force on said element in response to said flux urging it toward a predetermined position in the range of motion for said element;
   means responsive to the signal for adjusting the pattern of flux applied through said element;
   said sections being further configured to induce a motion of said element from said predetermined position in response to the adjusted pattern of flux applied to said element.

6. Apparatus for providing a rotation representative of the magnitude of a signal and including:
   a rotationally suspended element;
   a first set of magnetic poles for applying flux to said element;
   a second set of magnetic poles for applying flux to said element;
   said element having a first section of high permeability material extending on the surface of said element partially across each of the pole faces of said first and second sets of magnetic poles;
   said element further having at least one second section of high permeability material magnetically isolated from the fist section and extending on the surface of said element partially across poles from different sets to poles to provide a low magnetic reluctance path therebetween;

means for applying a magnetic flux to each of the poles in the first and second sets to produce an elastic restraint for said element to a predetermined angular position; and means for varying the flux in response to the signal in a first direction in the first set of poles and for varying the flux in response to the signal in an opposite direction in the second set of poles thereby to torque the element in response to the varied flux to an angular position representative of the magntiude of the signal.

7. The apparatus of claim 1 further including:

means for varying the first flux in response to a further signal thereby to provide motion of said element representative of the ratio of said signal and said further signal.

8. Apparatus for providing a rotation representative of the magntidue of a signal comprising:

an element suspended for rotation and having first and second concentric arcs of high permeability material separated by a region of low permeability;

a first high permeability arcuate band of radius similar to the first arc of said element and arc length substantially greater than said first arc;

said first band placed coaxially to said element above said first arc;

said first band having a further arcuate band matching in radius the second arc of said element and positioned thereabove and coaxially thereto;

a second high permeability arcuate band of radius similar to the first arc of said element and of arc length substantially greater than said first arc;

said second band placed coaxially below said element and below said first arc;

said second band having a further arcuate band of radius similar to said second arc and positioned therebelow and coaxially thereto;

means for applying magnetic flux between said first and second arcuate bands at positions generally central thereof to indux flux to flow through said first arc and further through said second arc between the further arcuate bands;

means responsive to said signal for weakening the magnetic flux in corresponding arms of said first and second arcuate bands and for strengthening the magnetic flux in the opposite arms of said first and second arcuate bands whereby said element roates to a degree representative of the magnitude of said signal.

9. A magnetic actuator for providing a motion in response to a signal comprising:

a movable element;

a first path for magnetic flux between first and second points of application of a magnetomotive force, the first path having;

a high permeability portion on said movable element; and a portion providing a variation in path reluctance of said first path in response to variation in the position of said movable element;

a source of magnetomotive force for applying a flux to said first path between said first and second points of application whereby said element is elastically restrained at a point of minimum reluctance in said first path;

a second path for magnetic flux between third and fourth points of application of a magnetomotive force, the second path having:

first and second portions of high permeability; and an intermediate portion of said movable element providing a variation in the reluctance of said second path with element motion;

means for applying a magnetic flux through said second path; and means for shifting the flux in said second path between the first and second portions of high permeability in response to said signal.

10. The actuator of claim 9 wherein the portions of high permeability in said first and second paths include press stamped bands.

11. The actuator of claim 10 wherein said element includes a rotor.

12. A magnetic actuator for providing a rotation in response to a signal comprising:

a stator having an axis and including:

first and second curved, coaxial and axially displaced bands of high permeability material, said first and second bands both extending a first angular portion of a circle;

a third curved band of high permeability material coaxial to the first and second bands and axially displaced therefrom, said third band extending a second angular portion of a circle which is less than the first portion;

a fourth curved band of high permeability material coaxial to the first and second bands and axially displaced therefrom, said fourth band extending a third angular portion of a circle which is lss than the first portion and only partially overlaps the angular extent of the third portion;

a rotor mounted for rotation coaxial to the stator and having:

a fifth high permeability band curved about said rotor and facing portions of said first and second bands over an angular extent much smaller than the first angular portion thereof;

a sixth high permeability band curved about said rotor and facing portions of the third and fourth bands to vary the magnetic reluctance between said third and fourth bands through said sixth band with rotation of said rotor, that reluctance having a minimum value at a predetermined position of angular rotation of the rotor;

means for applying a magnetic flux in a path through the sixth band between the third and fourth bands to produce an elastic restraint on the rotor at the angle of minimum reluctance;

means for applying a magnetic flux through the fifth band between the first and second bands in a pattern producing no net torque on said rotor; and means for shifting the path of flux in the first and second bands in response to said signal to produce a net torque on said rotor.

* * * * *

UNITED STATES PATENT AND TRADEMARK OFFICE
CERTIFICATE OF CORRECTION

PATENT NO. : 4,044,305
DATED : August 23, 1977
INVENTOR(S) : George A. Oberbeck

It is certified that error appears in the above-identified patent and that said Letters Patent are hereby corrected as shown below:

Column 1, line 55, after "signal," delete "a torque input signal,".
Column 2, line 31, "stator having" should read --stator 14 having--.
Column 2, line 34, "set for primary" should read --set of primary--.
Column 5, line 22, "and weaken" should read --and to weaken--.
Column 6, line 61, "The structure 150 illustrated in Fig. 9." should be deleted.
Column 8, line 35, "magnitude" should read --magnitude--.
Column 8, line 66, "fist" should read --first--.
Column 9, line 1, "sets to poles" should read --sets of poles--.
Column 9, line 20, "magnitude" should read --magnitude--.
Column 9, line 49, "roates" should read --rotates--.
Column 10, line 38, "lss" should read --less-.

Signed and Sealed this

Twenty-fourth Day of January 1978

[SEAL]

Attest:

RUTH C. MASON
Attesting Officer

LUTRELLE F. PARKER
Acting Commissioner of Patents and Trademarks